United States Patent [19]

Pryor et al.

[11] Patent Number: 4,712,161
[45] Date of Patent: Dec. 8, 1987

[54] HYBRID AND MULTI-LAYER CIRCUITRY

[75] Inventors: Michael J. Pryor, Woodbridge; Charles J. Leedecke, Northford; Norman G. Masse, Wallingford, all of Conn.

[73] Assignee: Olin Corporation, New Haven, Conn.

[21] Appl. No.: 811,905

[22] Filed: Dec. 20, 1985

Related U.S. Application Data

[63] Continuation-in-part of Ser. No. 715,446, Mar. 25, 1985, abandoned, which is a continuation-in-part of Ser. No. 707,633, Mar. 4, 1985, abandoned.

[51] Int. Cl.$^4$ .............................................. H05K 7/06
[52] U.S. Cl. ..................................... 361/411; 29/846; 174/68.5; 361/397; 361/414; 428/209
[58] Field of Search ................... 361/400, 403, 6, 411, 361/414, 397; 174/68.5, 52 FP, 52 S; 428/209–210, 427, 432, 450, 469, 901; 427/96; 29/684

[56] References Cited

U.S. PATENT DOCUMENTS

| | | |
|---|---|---|
| 3,200,298 | 8/1965 | Garibotti . |
| 3,723,176 | 3/1973 | Theobald et al. . |
| 3,809,797 | 5/1974 | McMunn, III et al. ....... 174/68.5 X |
| 3,816,172 | 6/1974 | Hoffman ........................ 428/210 X |
| 4,070,518 | 1/1978 | Hoffman ............................. 428/209 |
| 4,152,282 | 5/1979 | Baudry et al. ................ 106/39.6 X |
| 4,221,047 | 9/1980 | Narken et al. ....................... 357/80 |
| 4,237,606 | 12/1980 | Niwa et al. ..................... 174/68.5 X |
| 4,299,873 | 11/1981 | Ogihara et al. . |
| 4,301,324 | 11/1981 | Kumar et al. . |
| 4,311,522 | 1/1982 | Batra et al. ................ 148/11.5 C X |
| 4,313,026 | 1/1982 | Yamada et al. . |
| 4,340,902 | 7/1982 | Honda et al. ......................... 357/80 |
| 4,385,202 | 5/1983 | Spinelli et al. . |
| 4,490,429 | 12/1984 | Tosaki et al. .................. 174/68.5 X |
| 4,491,622 | 1/1985 | Butt . |

FOREIGN PATENT DOCUMENTS 1232621 5/1971 United Kingdom .
1349671 4/1974 United Kingdom .

OTHER PUBLICATIONS

Chang, W. H., Kiseda, J., Rifkin, A., Staats, R. W., "Personalizing Pre-Packaged Semiconductor Devices", IBM Tech. Disl. Bul., vol. 17, No. 7, 12/74.
"Packaging" by Jerry Lyman, Electronics, vol. 54, No. 26, Dec. 29, 1981.
"Tab Technology Tackles High Density Interconnections" by Dickson, Electronic Packaging and Production, Dec. 1984, pp. 34–39.

Primary Examiner—Arthur T. Grimley
Assistant Examiner—Jane K. Lau
Attorney, Agent, or Firm—Paul Weinstein

[57] ABSTRACT

The present invention is directed to the process of forming a multi-layer or hybrid circuit assembly. The assembly includes at least one ceramic substrate having a deoxidized or oxygen free copper alloy foil bonded thereto by a bonding glass. The copper alloy foil may be a circuit to which a resistive metal alloy tape can be bonded so as to provide a path of precise resistance. Also, layers of foil may be glass bonded to a substrate and stacked to form multi-layer circuits.

29 Claims, 26 Drawing Figures

HYBRID AND MULTI-LAYER CIRCUITRY

This application is a continuation-in-part of U.S. Pat. Application Ser. No. 715,446, filed Mar. 25, 1985 (now abandoned). Application Ser. No. 715,446 is a continuation-in-part of U.S. patent application Ser. No. 707,633, filed Mar. 4, 1985 (abandoned).

This application is related to U.S. patent application Ser. No. 413,046 entitled "Multi-Layer Circuitry" by Sheldon H. Butt, filed Aug. 30, 1982; U.S. patent application Ser. No. 651,984 entitled "Sealing Glass Composite" by Edward F. Smith, III, filed Sept. 19, 1984 (now abandoned); U.S. patent application Ser. No. 651,987 entitled "Sealing Glass Composite" by Edward F. Smith, III et al., filed Sept. 19, 1984 (now abandoned); U.S. patent application Ser. No. 707,636 entitled "Pin Grid Arrays" by Michael J. Pryor, filed Mar. 4, 1985 (now abandoned); U.S. patent application Ser. No. 811,908 entitled "Steel Substrate With Bonded Foil" by Richard A. Eppler, filed Dec. 20, 1985 (now abandoned); U.S. patent application Ser. No. 811,846 entitled "Metal-Glass Laminate" by Charles J. Leedecke et al.; U.S. patent application Ser. No. 811,911 entitled "A Hermetically Sealed Package" by Michael J. Pryor et al., filed Dec. 20, 1985; U.S. patent application Ser. No. 811,910 entitled "A Method of Joining Metallic Components" by Michael J. Pryor et al., filed Dec. 20, 1985; U.S. patent application Ser. No. 811,907 entitled "Hybrid And Multi-Layer Circuitry" by Michael J. Pryor et al., filed Dec. 20, 1985; U.S. patent application Ser. No. 811,906 entitled "Multi-Layer And Prin Grid Arrays" by Michael J. Pryor, filed Dec. 20, 1985; and U.S. Pat. No. 4,491,622 entitled "Composites Of Glass-Ceramic To Metal Seals And Method Of Making The Same" by Sheldon H. Butt, issued Jan. 1, 1985.

While the invention is subject to a wide range of applications, it is particularly suited for hybrid circuitry and multi-layer applications and will be particularly described in those connections. More specifically, the invention is directed to bonding an oxygen-free or deoxidized copper alloy foil to a ceramic substrate with a relatively low temperature, bonding glass. In one embodiment, the copper alloy foil is etched to form bumps and a resistive metal strip then is bonded to the bumps to form a precise resistive path. In another embodiment, a plurality of substrates having foil bonded thereto are bonded to each other to form multi-layer circuitry.

As the density of integrated circuit (IC) devices, also known as chips, has continued to increase, the chips are often mounted on hybrid circuitry. Despite continued advances in IC design and capability, the hybrid circuitry technology has remained substantially static.

Examples of hybrid circuitry design are described in a number of patents including U.S. Pat. Nos. 3,200,298, 3,723,176, 4,299,873 and 4,313,026. The hybrid substrate is typically a thin and relatively small piece of ceramic material, such as $Al_2O_3$, mixed with an organic binder and formed into a green sheet or substrate. Size is typically limited to a square of about four square inches. Conductive circuitry on the hybrid substrate may be formed by first silk screening a paste of gold, glass and a binder in any desired pattern onto a surface of the green ceramic substrate. The resulting assembly is fired at about 850° C. to first drive off the binder from the paste and then to sinter the glass and the gold. The fired glass-gold conductor has only about 60% of the electrical conductivity of bulk gold. Resistors are applied by similar techniques, i.e. print screening of a resistor paste, and utilize such resistive materials as nichrome and carbon. Because of non-uniformities in the geometry of the resistors and because of local variations in their composition, the resistors must be individually measured and laser trimmed to an acceptable resistance range, a most expensive and time consuming procedure. Both resistor and conductor technology using thick film pastes also suffer from lot to lot variations of the pastes themselves. The cost associated with this thick film technology has inhibited its use where viable alternatives are available. However, the requirement for increasing the density of IC devices has forced its increased use despite all of the disadvantages enumerated above.

An alternative process involves thin film technology where resistors and conductors are vacuum evaporated or sputtered onto 99% alumina substrates. These techniques are even more expensive because of the very slow deposition rates of the resistors and conductors and because of the very high price of the 99% alumina substrate material.

To overcome the requirement for high cost gold conductors, there have been ongoing attempts to replace the gold paste with copper foil. One advantage of this substitution would be the ability to form more precise circuitry using dry film photoresist and conventional printed circuit board etching techniques. Dry film photoresist and conventional printed circuit etching are excellent techniques to produce accurate, reproducible and comparatively fine line circuitry on a copper layer bonded to a ceramic substrate. For example, 3 mil line widths on 3 mil spacings are relatively easy to generate using the above mentioned techniques. By contrast, the results from silk screened gold pastes is typically a 10 mil line width and somewhat more than 10 mil spacing. Also, cost comparisions are enormously favorable with forming circuitry in a copper layer.

Up until now, attempts to bond copper foil to alumina with glass under reducing conditions have invariably resulted in extensive blistering of the foil. This is due in part to the common use of CDA 11000 foil which contains cuprous oxide as a separate phase. When fired in a reducing atmosphere, the cuprous oxide in the alloy CDA 11000 is reduced and steam blistering results. It is also thought that blistering partially results from air entrapment in the glass due to the lack of a significant avenue of escape during the firing cycle. Blistering is particularly detrimental for multi-layer and hybrid circuitry because it creates a weak bond between the ceramic substrate and the copper foil which can lead to delamination. Also, during the etching process, the etching solutions can seep into a blister, at the glass to foil interface, and etch the foil at an undesirable location.

In an attempt to eliminate the problem of blistering, bonding under oxidizing conditions has been attempted as disclosed in a paper entitled "The Direct Bonding of Metals to Ceramics by the Gas-Metal Eutectic Method" by Burgess et al., published in *J. Electrochemical Society: SOLID-STATE SCIENCE AND TECHNOLOGY*, May, 1975. This technique has attempted to take advantage of the high temperature cuprous oxide formed on the foil. Although this approach produced good bonds without blistering, it formed a high temperature cuprous oxide film on the outer surface of the foil; this film is extremely difficult to remove.

The present invention also relates to multi-layer circuitry of which pin grid arrays or side brazed packages are typical examples. Pin grid arrays are typically small, multi-layer 96% alumina boards with conductive circuitry between the layers. The pin grid array minimizes the size required for large integrated circuits and permits the use of higher pin counts than possible with conventional quad packs. Side brazed packages are similar in construction to pin grid arrays except that electrical contact to the electrical circuitry is with pins brazed onto the side of the package. Both of these package designs provide rugged, reliable, hermetic packages and are preferable to CERDIPs because they are not dependent on glass encapsulation of the leads.

Conventional pin grid arrays typically contain at least three layers of alumina made by the tape cast process. The interlayer circuitry is fabricated with tungsten or moly-manganese powder silk screened onto a green alumina tape (96% $Al_2O_3$). The interconnects between the interlayer circuitry are provided through approximately about 5-10 mil holes punched in the green alumina tape. The interconnect or through-hole conductors are also formed with tungsten or moly-manganese powder. The multi-layer alumina tapes and conductor paths are cofired in the region of about 1550°-1600° C. This expels the polymeric binder from the alumina tape, sinters the 96% $Al_2O_3$ and produces partial sintering of the current carriers. The exposed conductors may then be coated with nickel by an electroless process. Thereafter, gold plated lead pins are brazed to the through-hole conductors.

There are a number of costly, technical problems in manufacturing pin grid arrays using the foregoing technology. The most serious technical problem is the very large volume contraction of the alumina tape when it is fired at high temperatures. The volume contraction can be as much as 40% and results in a linear contraction of almost 20%. This causes severe problems in the location of the through-holes relative to the pins and also in maintaining through-hole electrical contact. In some cases, the contraction is so high that the conductive transverse circuitry misses the pin altogether. The conventional means of silk screening the interlayer circuitry on the alumina tape results in circuitry which is relatively dense and well sintered. However, the through-hole contact, which may be inserted mechanically, can be very loose and provide only low frequency particle to particle contact.

In the past, glass-ceramic structures with circuit patterns embedded therein were disclosed in U.S. Pat. No. 4,385,202 to Spinelli et al.; U.S. Pat. No. 4,301,324 to Kumar et al.; U.S. Pat. No. 4,313,026 to Yamada et al.; British Pat. No. 1,232,621 and British Pat. No. 1,349,671. Each of these patents specifically differs from the present invention in that it fails to teach or suggest the bonding of a deoxidized or oxygen free copper or copper alloy foil to a ceramic substrate with a relatively low temperature sealing glass.

Multi-layered alumina circuit boards, whose layers are formed with the process of the present invention, are particularly useful as pin-grid arrays of the general type disclosed in the article entitled "Packaging" by Jerry Lyman, *Electronics*, Vol. 54, No. 26, Dec. 29, 1981.

It is a problem underlying the present invention to form a hybrid or multi-layer circuit board assembly capable of high temperature stability wherein one or more layers of copper alloy foil are bonded to one or more layers of ceramic substrate without forming blisters or bubbles at the interface between the foil layer or layers and the ceramic substrate(s). An additional problem relates to the production of resistors on hybrid circuits which are accurate and easy to manufacture.

It is an advantage of the present invention to provide an improved hybrid or multi-layer assembly and a process of forming hybrid or multi-layer circuit assemblies which obviate one or more of the limitations and disadvantages of the described prior processes and arrangements.

It is a further advantage of the present invention to provide an improved hybrid or multi-layer assembly and a process of forming hybrid or multi-layer circuit assemblies with one or more ceramic substrates having a deoxidized or oxygen free copper alloy foil bonded thereto with a glass.

It is a still further advantage of the present invention to provide an improved hybrid or multi-layer assembly and a process of forming a hybrid or multi-layer circuit assembly having electrical circuitry and a resistor formed of a metal foil which is bonded to the circuitry in accordance with the teachings of the present invention.

It is a further advantage of the present invention to provide an improved side brazed package and process of making the side brazed package with the circuitry formed on oxygen free or deoxidized copper foil which is bonded to a substrate with a glass.

Accordingly, there has been provided an improved hybrid or multi-layer circuitry and the process of forming a multi-layer or hybrid circuit assembly. The assembly includes at least one ceramic substrate having a deoxidized or oxygen free copper alloy foil bonded thereto by a low temperature sealing glass. The copper alloy foil may etched and a resistive metal alloy tape can be bonded thereon so as to provide a path of precise resistance. Also, layers of foil may be glass bonded to a substrate and stacked to form multi-layer circuits. A side brazed package and a process of making the package is disclosed. The package includes a deoxidized or oxygen free copper circuit foil bonded to a substrate with a glass.

The invention and further developments of the invention are now elucidated by means of the preferred embodiments in the drawings.

Figure 1:
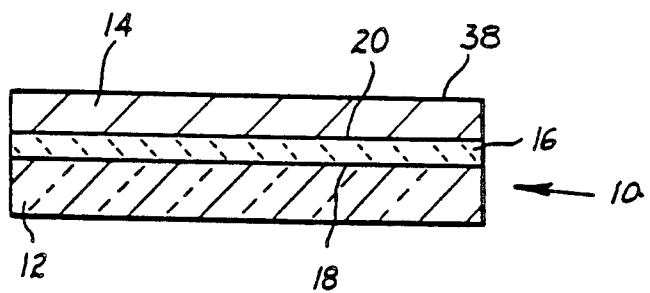
FIG. 1 illustrates a copper alloy layer bonded to a ceramic substrate with a bonding glass.
Figure 4:
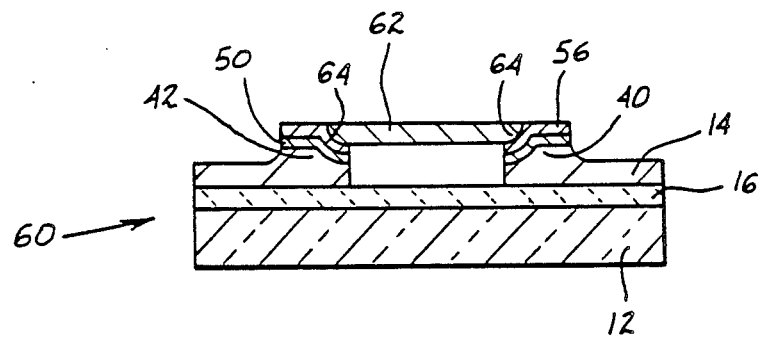
FIG. 4 illustrates a side cross sectional view of a resistive tape bonded between two cladded bumps.

The hybrid or multi-layer integrated circuitry according to the invention will be described with reference to the drawings. In FIG. 1, a layered assembly 10 is illustrated having a substrate 12 formed of a ceramic material and a cladding layer 14 of a copper foil. The substrate and the cladding layer are bonded together by a glass 16. In fabricating the assembly 10, a coating of the glass may be applied to at least one surface of the substrate 12. Then the cladding layer 14 is disposed on the coated surface and the assembly is fired under reducing conditions so that the glass coating melts into a substantially continuous glaze which bonds the cladding layer to the ceramic substrate. Finally, circuitry may be etched into the clad layer. The circuitry may be modified to form a hybrid circuit as shown in FIG. 4. Alternatively, the layered assembly may be stacked with one or more additional layers similar to assembly 10 to form a multi-layer assembly as illustrated in FIG. 6E.

The substrate 12 may be formed from an unfired ceramic sheet (green sheet) which may be constituted of materials including silica, silicon carbide, alumina silicate, zirconia, zircon, berylia, alumina having a purity of about 90 to about 99%, and mixtures thereof. Preferably, the ceramic material is a commercial 96% alumina which typically includes about 94.5% $Al_2O_3$ and the remainder including silica, manganese, calcium, and magnesium. It is also within the terms of the present invention to use combinations of the ceramic materials mentioned above or other ceramic materials as desired.

The cladding 14 is preferably a copper or copper alloy having an electrical conductivity of more than about 60% IACS. This high conductivity copper alloy preferably has alloy additions which make up less than about 10% of the alloy and the remainder being copper. Examples of copper alloys which are thought to be suitable for practicing this invention include CDA 15100, CDA 12200, CDA 10200, and CDA 19400. The selected copper alloy cladding material is preferably a foil, such as one ounce foil, which has been deoxidized. Using a deoxidized copper alloy foil is particularly important to prevent blistering within the foil or at the interface with the glass 16 as will be further described herein.

It is also within the terms of the present invention to select the copper cladding 14 from an oxygen free copper which is typically an electrolytic copper substantially free from cuprous oxide and produced without the use of residual metallic or metalloidal deoxidizers. Generally, the composition of oxygen free copper is at least 99.95% copper with silver being considered as copper. Examples of oxygen free copper include CDA 10100, CDA 10200, CDA 10400, CDA 10500 and CDA 10700.

The bonding material 16 is preferably a sealing and/or bonding glass which forms a flowable mass at a temperature below about 1000° C. The glass is further selected to adhere to both the ceramic substrate and the copper alloy cladding. The glass may be selected from the group consisting of silicate, borosilicate, phosphate and zinc borosilicate glasses. Preferably, the glass selected is a borosilicate glass of a general composition $MO$—$B_2O_3$—$SiO_2$, where $MO=Al_2O_3$, $BaO$, $CaO$, $ZrO_2$, $Na_2O$, $SrO$, $K_2O$ and mixtures thereof. The expansion of the glass can be altered by adjusting the constituents or through the addition of appropriate fillers such as cordierite, beta eucryptite or zirconium silicate. Preferably, the glass will be adjusted to have a desired coefficient of thermal expansion (CTE) in the range of about $50 \times 10^{-7}$ to about $100 \times 10^{-7}$ in/in/°C. More particularly, the CTE of the glass will be slightly less than the substrate in order that the bonded glass is in compression. For example, with a substrate of alumina, the glass would preferably have a CTE of about $66 \times 10^{-7}$ to about $70 \times 10^{-7}$ in/in/°C. The glass is selected to form a flowable mass within the temperature range from about 500° to about 1000° C. and most preferably from about 600° to about 950° C.

To apply the glass to the substrate, it is desirable to form a slurry of glass particles suspended in a medium convenient to the designated method of application. For example, the glass may be blended with a binder such as Elvacite ®, a product of DuPont Corporation and a conventional vehicle such as terpeneol. The result is a paste or slurry of a suitable viscosity where it may be applied to the substrate by any conventional technique such as screen printing. Alternatively, the glass can be blended with a suspending agent such as bentonite and water as a vehicle to form a slurry of suitable viscosity for spraying or dipping.

In forming the assembly 10 of FIG. 1, a slurry of the glass is coated onto the surface 18 of the substrate 12. The substrate and glass coating are then dried and heated to a temperature from about 500° to about 1000° C. so as to sinter the glass coating onto the substrate. Then, the copper alloy foil 14 is disposed with its surface 20 against the sintered glass coating 16. The entire assembly is then reheated in a reducing or inert atmosphere to a temperature of about 500° to about 1000° C. so that the copper alloy foil 14 is bonded to the substrate 12.

The substrate may also be bonded to the copper foil with a thin, essentially pore free glass preform. The preform may be bonded to either the foil or substrate. Then the foil is disposed against the substrate and heated so that the glass bonds the foil to the substrate. Alternatively, the glass preform may be placed between the foil and the substrate. The assembly is then heated, and placed under pressure, if desired, so that the substrate is bonded to the layer of foil. Since the solid glass preform is essentially pore free, it can be advantageously used in the present invention. The etchant used to dissolve the foil layer and form the circuitry does not have the tendency to attack and dissolve the pore free glass. Therefore, the circuitry formed on the foil with the glass preform may be more precisely configured as desired.

The glass is preferably selected to be free of lead oxide since lead oxide will partially reduce when heated in a reducing atmosphere. Lead in the glass may destroy the insulating value of the ceramic by developing short circuits in the foil after etching. It is also desirable that the glass be essentially free of bismuth oxide since the latter may also partially reduce and may lower or destroy the insulating value of the ceramic by developing short circuits in a manner similar to lead as described above.

There are two important process steps which are preferred to prevent blistering of the foil. Firstly, the foil is preferably an oxygen free or a deoxidized copper or copper alloy. Secondly, the bonding preferably occurs under reducing or inert conditions. For example, the assembly is fired in an atmosphere of inert or reducing gas such as for example, nitrogen, nitrogen 4% hydrogen or argon. The use of deoxidized or oxygen free copper foil prevents blistering within the foil when it is bonded under the reducing conditions.

Another important key for eliminating the problem of blistering is to allow any entrained air to escape before the copper foil is actually bonded to the substrate. This condition may be handled by coating and reflowing the glass on the substrate prior to the application of the copper foil. Then, the copper foil is placed on the glass coating and heated to the bonding temperature preferably while pressing the foil against the glass coating under a pressure of from about 50 to about 300 pounds per square inch. In the event that the escape of air between the foil and the coated substrate is insufficient, the glazed substrate can be exposed to a moderate vacuum so as to positively expel any residual air and binder. The desired circuitry may now be produced in the bonded, unblistered foil by conventional techniques as will be further described.

Figure 3A:
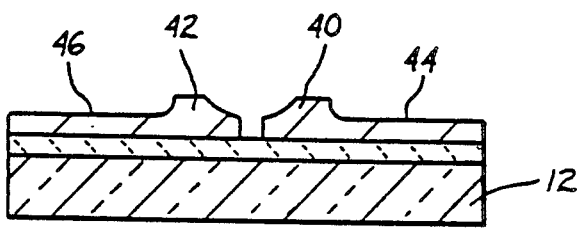
FIGS. 3A-3C illustrate the series of steps to etch bumps on copper alloy layer and coat the bumps with a precious metal coating.
Figure 3B:
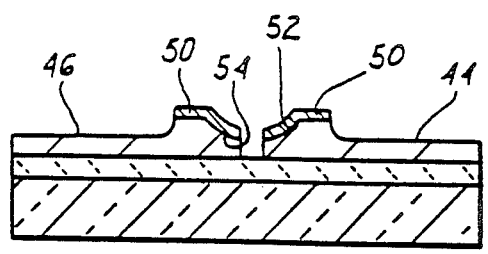
Figure 3C:
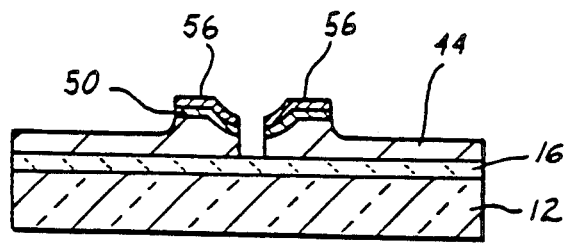

Referring to FIGS. 3A-3C, there are illustrated the stages in which the structure incorporating the embodiment illustrated in FIG. 1 may be processed to form the desired electricity conductive circuitry. The outer surface 38 of the assembly 10 is first coated with a positive photo-resist which may consist of a light sensitive resin of the photodegradable type. Then, a prescribed patterned mask of material, opaque to exposing light, is placed in contact with the photo-resist. On light exposure, only the unmasked portion of the photo-resist layer gets exposed. The mask is then removed and the resist is developed. The exposed portions of the resist are removed and the copper circuit is formed in a subsequent etching process. The etching may be accomplished with any conventional solution such as a FeCl$_3$/HCl copper etchant. The assembly may be coated with photo-resist and etched in this manner several times to produce the desired patterns and structures. In FIG. 3A, the copper layer or foil has been photo etched to leave two bumps 40 and 42 having their outermost surfaces 38 extending above the etched top foil surfaces 44 and 46.

The remaining bumped foil is particularly advantageous for connecting to electrical components such as a resistor described herein. Details of the typical bump formations are described in the artical entitled "Tab Technology Tackles High Density Interconnections" by Dickson, pages 34–39, in the December, 1984, issue of *Electronic Packaging and Production*. Although a specific means of forming the bumps has been described hereinbefore, it is within the terms of the present invention to use any other desired manufacturing technique such as machining to form the bumps.

Next, as illustrated in FIG. 3B, a barrier layer 50 is preferably applied to the surface of the bump. If desired, the barrier layer may coat all or part of the remaining surface 44 and 46 of the foil. Note that the barrier layer 50 is illustrated as extending down onto the portions 52 and 54 of the bumps. The barrier layer is provided to prevent diffusion between the copper layer and the precious metal which is to be coated on the surface of the barrier layer as described herein. Also, the barrier layer enhances the bonding of the precious metal to the selected surface of the copper layer. The material selected for the barrier layer may be selected from the group including nickel, titanium, boron nitride and alloys thereof. It is also within the terms of the present invention to use any other barrier layer material which is suitable for preventing interdiffusion between the selected adjacent metals. The barrier layer may be coated onto the surface of each bump, and if desired onto the remainder of the copper layer, by any desired technique such as electrodeposition.

Then, as illustrated in FIG. 3C, the barrier layer is preferably coated with a precious metal layer 56 of material such as gold, platinum, silver, paladium and alloys thereof. The precious metal is coated onto the barrier layer using any desired technique such as electrodeposition.

After the conductive circuitry has been formed, a significant cost resides in the application of the electrical resistors. As described hereinbefore, they typically require electrical monitoring and laser trimming when they are formed by the application of thick film paste. The present invention discloses a unique technique to construct relatively inexpensive, easily reproduced resistors. Specifically, punched foil resistors are attached to the bumped portions of the circuitry by any bonding technique such as conventional thermocompression bonding. The foil of the resistors is preferably made by a conventional metal rolling process where the thickness can be controlled to extremely fine tolerances. Also, the width of the foil can be precisely controlled with precision blanking techniques. Since resistors made of foil are susceptible to extremely precise geometry as well as precise compositional control, they produce a highly reproducible, precise electrical resistance. It is also within the terms of the present invention to form the resistors by photoetching techniques as described herein.

Referring to FIG. 4, there is illustrated an electrical conductive circuit assembly 60 having a strip 62 of resistor foil attached thereto. The circuit is essentially the same as that illustrated in FIG. 3C where a copper alloy conductive foil layer 14 is bonded to a substrate 12 by a glass 16. It is also within the terms of the present invention to form the circuit assembly with an adhesive of the type described with reference to the embodiment illustrated in FIG. 2. The bumps 40 and 42 are coated with a barrier layer 50 and a precious metal layer 56.

The resistor foil 62 may be formed of a high electrical resistance alloy which is preferably ductile and of reasonably high strength. The resistance of the material is preferably between about 100 to about 1000 ohms per circular mil ft. Examples of suitable materials consist essentially of iron-base alloys, nickel-base alloys and copper-base alloys. A particularly useful alloy is a nickel-chromium-iron alloy such as Nichrome ®, a product of the Driver-Harris Company. The foil may be rolled to a very fine gage of about greater than about 1 mil in thickness. It is also within the terms of the present invention to use a wire which may also have a diameter of greater than about 1 mil. In order to roll the foil down to the desired gage, the material preferably should be rather ductile. Further, it is important that it have enough strength to be conveniently handled after it is formed.

Figure 5:
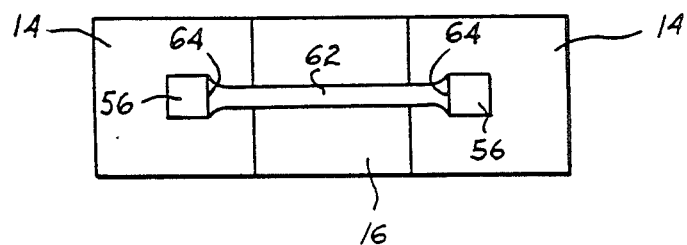
FIG. 5 is a top view of the device of FIG. 4.

Referring to FIG. 5, there is illustrated the top view of the circuit device 60 which illustrates a possible geometry suitable for a resistive foil 62. The edges 64 of the resistive foil which are bonded to the gold coating on the raised bumps 40 and 42 are preferably coated with the same precious material as the coating 56. The resistive foil strip is bonded to the precious metal layer on the bumps by any desired technique such as thermocompression bonding which is typically used in tape automated bonding technology. The ends of the resistive tape which are bonded to the bumps may be wider than the remainder of the tape so that a good bond can be effected while controlling the final electrical resistance of the foil.

Referring to FIGS. 6A through 6E, there is illustrated the stages in which a multi-layer circuit embodying the basic ceramic-glass-copper foil layered structure described herein and illustrated in FIG. 1. The reference numerals which are double primed designate components that are essentially identical to the components designated by the unprimed reference numerals described herein.

Figure 6A:
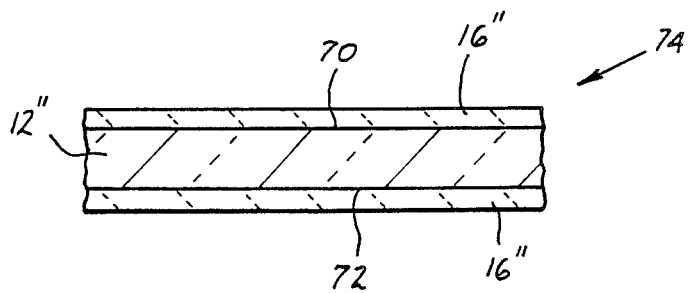
FIGS. 6A-6E illustrate the series of steps for forming a multi-layer circuit.
Figure 6B:
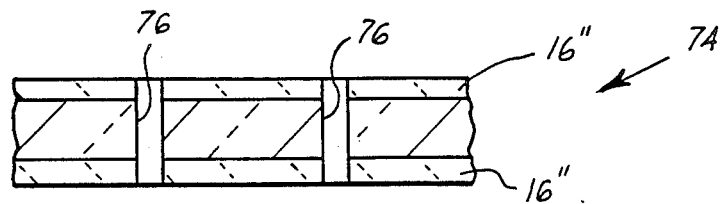
Figure 6C:
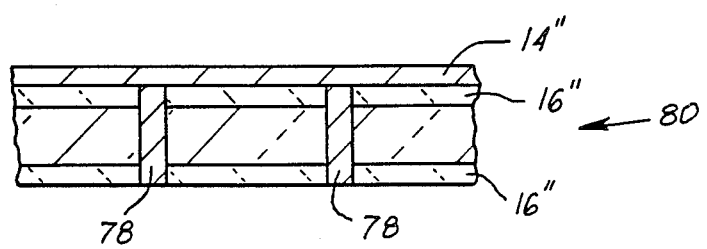

Referring to FIG. 6A, a first ceramic substrate 12" is first coated or glazed with a bonding material 16" on opposite outer surfaces 70 and 72 to form a glazed substrate 74. The glazed substrate is processed to form any number of through-holes 76 in any desired location or pattern, as indicated in FIG. 6B. The through-holes may be formed by any desired technique such as laser drilling. Then, as indicated in FIG. 6C, the through-holes may be filled with a conductor 78 such as a conventional conductive paste, a solid conductive wire or plated by techniques such as electroless plating and/or electroplating and filling with a conductor such as solder. A first layer of deoxidized or oxygen free copper foil 14" is disposed upon the glaze 16". The resulting assembly 80 is then heated to the bonding temperature while pressing the layer of foil against the glass coating 16" under a pressure of between about 50 to about 300 pounds per square inch.

It is also within the terms of the present invention to replace the glaze with a thin, essentially nonporous glass preform of the same composition as the glaze. The glass preform may be bonded to either the foil or the substrate or alternatively be disposed between the foil and the substrate. The stacked layers are then subjected to heat and pressure and bonded together. The through-holes may be formed subsequent to the forming of the bonded layers. The use of deoxidized or oxygen free copper alloy foil in combination with a moderate vaccuum, if required, prevents the blistering of the foil on the sealing glass as described herein.

Figure 6D:
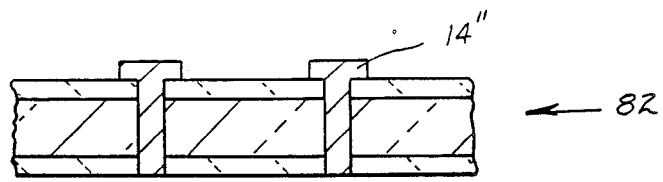
Figure 6E:
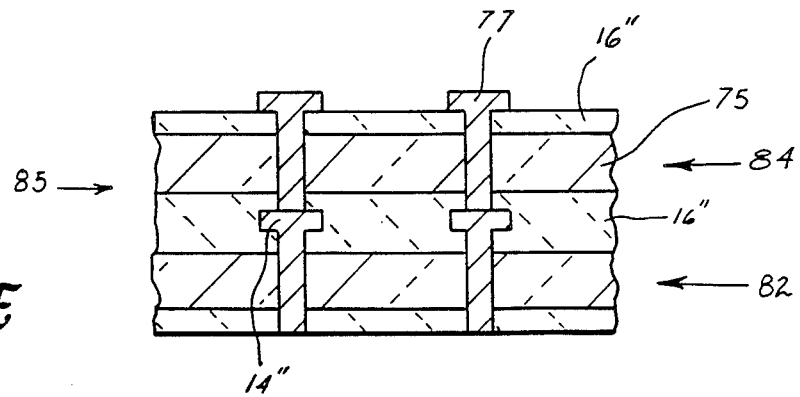

The desired circuitry may now be formed in the foil 14" by conventional techniques such as photo-etching. The resulting structure 82, as illustrated in FIG. 6D, may be stacked together with any number of similarly formed structures. For example, a structure 84 comprises a second ceramic substrate 75, a glass 16" and a second layer of copper foil 77, preferably selected from the same material as first foil 14". The structure 84 may be stacked on structure 82 and bonded with the glass 16". If desired an additional layer of glass, such as a preform of the desired glass composition, may be disposed between the structures to provide the desired glass thickness to form an adequate bond and to simultaneously electrically insulate the metal layers from each other. Then, the structures 82 and 84 can be pressed together and exposed to glass sealing temperatures in excess of about 500° C. to form the multi-layer circuitry 85 as shown in FIG. 6E. If necessary the conductor material may be extended from the through holes to contact the intermediate circuitry as required. Further, any additional number of structures, similar to structures 82 and 84, may be stacked on the multi-layer circuitry to form any desired number of layers. Also, pins may also be brazed onto the exposed circuitry to interconnect with other electronic devices.

Figure 7A:
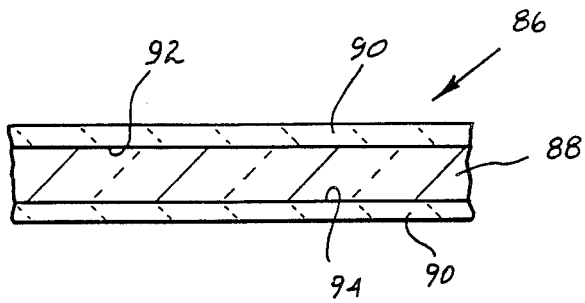
FIGS. 7A-7D illustrate an alternative series of steps for forming a multi-layer circuit.
Figure 7B:
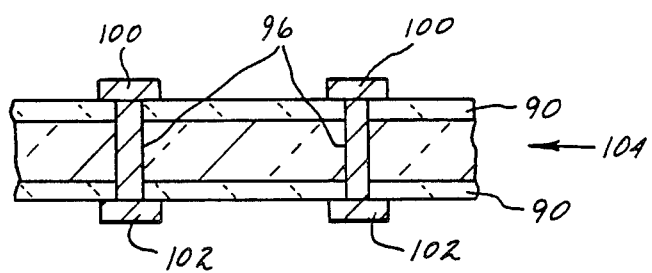
Figure 7C:
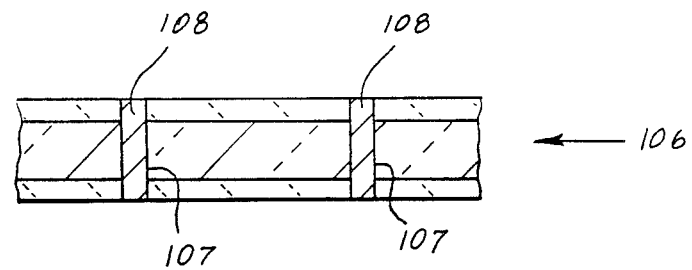
Figure 7D:
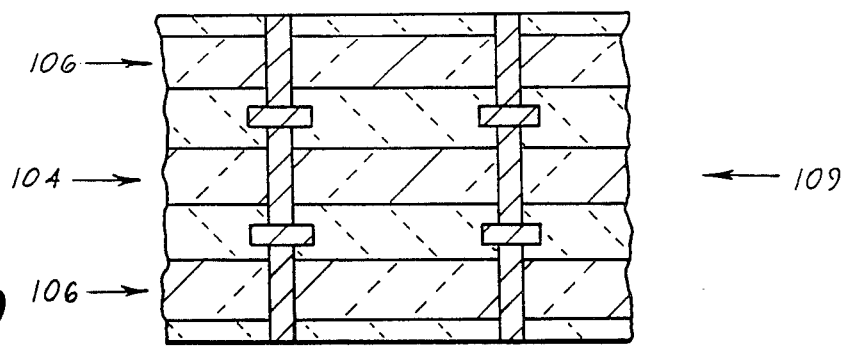

Referring to FIGS. 7A through 7D, there is illustrated the stages of another process, similar to the steps illustrated in FIGS. 6A–6D, to form the multi-layer circuit structure 109 of FIG. 7D. FIG. 7A illustrates a structure 86 formed of a ceramic substrate 88 which is essentially the same as substrate 12 and layers of glass 90. The glass coating or glass preform 90, of essentially the same composition as glass 16, is applied to both of the opposite outer surfaces 92 and 94 of substrate 88. As explained above, the glass may be a solid, pore free preform which is bonded to or disposed adjacent the substrate. The resulting structure 86 may then be further processed in at least two ways.

Referring to FIG. 7B, any number of desired through-holes 96 be formed through the glass and ceramic substrate using any technique such as laser drilling. The holes are filled with a conductive material 97 such as a glass-copper paste, or a solid metal or alloy wire as described herein. Then, layers 100 and 102 of deoxidized or oxygen free copper or copper alloy foil, selected from the same material as foil 14, are bonded to the glass layers 19. The glass layers may also be essentially pore free preforms which were bonded to the layers of foil prior to disposing the foil layers against the substrates. The copper foil layers are then etched by any conventional technique to form circuitry of any desired configuration as exemplified by the illustration of structure 104 in FIG. 7B.

The structure 86 of FIG. 7A may alternatively be processed to form a structure 106 as shown in FIG. 7C. In this embodiment, through-holes 107 are first formed by any desired manufacturing technique such as laser drilling or punching. The through-holes 107 may then be filled with a conductor 108 such as a conductive paste, a solid wire or plated and if desired, filled with a conductor such as solder, as described herein.

Structures 104 and 106 may be stacked so that one structure 104 is between two structures 106. The layered structure is then heated and pressed together to form a multi-layer assembly 109 as shown in FIG. 7D. If desired, additional glass preforms may be disposed between structures 104 and 106. The advantage of forming the different structures 104 and 106 is that alternate structures ie., 106 do not require the provision of copper layers or the step of etching. Although three structures are stacked to form multi-layer circuit assembly 109, it is also within the terms of the present invention to stack any desired number of alternative layers 104 and 106 to form an assembly with any desired number of circuit layers.

Figure 8A:
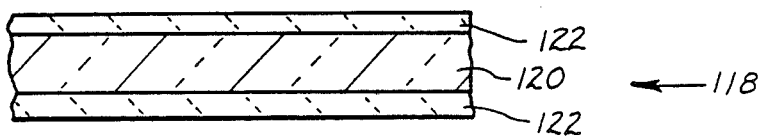
FIGS. 8A-8D illustrate another alternative series of steps for forming a multi-layer circuit.

Referring to FIGS. 8A through 8D, there is illustrated an alternative approach for constructing a multi-layer circuit assembly of the type illustrated in FIG. 7D. In FIG. 8A, a structure 118 is comprised of a ceramic substrate 120, of substantially the same material as substrate 12, and a bonding glass 122 of substantially the same composition and fabricating characteristics as glass 16. The glass 16 is applied as a coating or preform to opposite surfaces of the substrate. This basic structure may now be processed in at least two different ways.

Figure 8B:
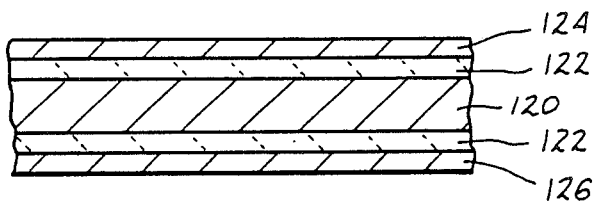

First, as shown in FIG. 8B, layers 124 and 126 of deoxidized or oxygen free copper foil are bonded to the glass layers 122 by heating the structure and pressing the layers of foil against the bonding glass as described herein. It is also within the terms of the present invention to provide a glass preform bonded to the foil layers.

Figure 8C:
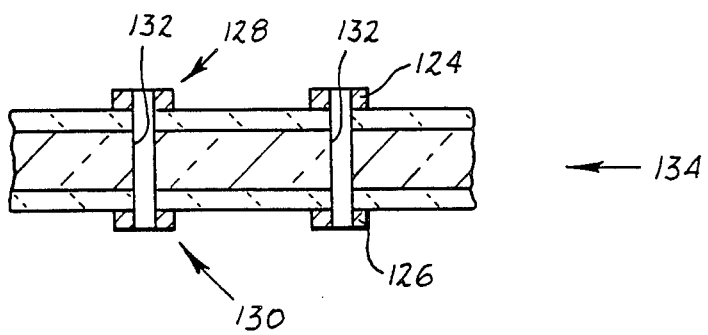

Referring to FIG. 8C, the copper foil layers 124 and 126 may be etched by any conventional technique to form circuitry 128 and 130 of any desired configuration. Then, through-holes 132 may be formed by any conventional technique, through the foil-glass substrate structure 134. The through-holes 132 may be filled with a conductive material 133 such as a conductive paste, a solid wire, or plated and if desired, filled with a conductor such as copper.

Figure 8D:
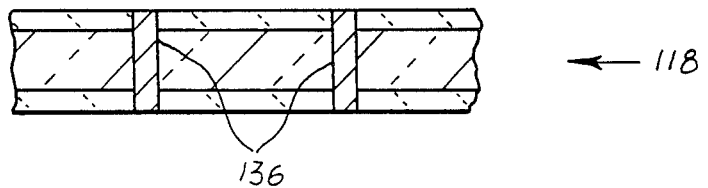

As shown in FIG. 8D, a second technique of processing structure 118 is to form through-holes 136 by any conventional technique. The through holes 136 may be filled with a conductive material 137, similar or the same as conductor 133.

The preferred embodiment is assembled with two of the structures 118 stacked on either side of structure 134. The stack is put under pressure and heated to the bonding temperature whereby a multi-layer assembly of the type shown in FIG. 7D is formed. It is also within the terms of the present invention to stack any number of alternative structures 134 and 118 to form a multi-layer assembly with any desired number of circuit layers.

Figure 9A:
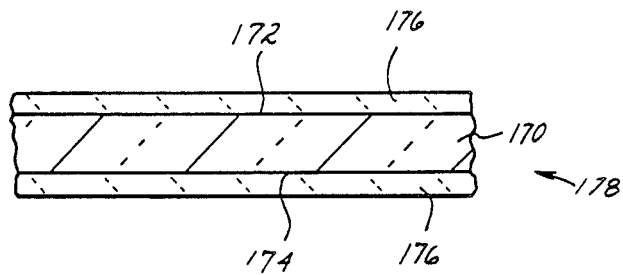
FIGS. 9A-9F illustrate the series of steps for forming a multi-layer circuit.
Figure 9B:
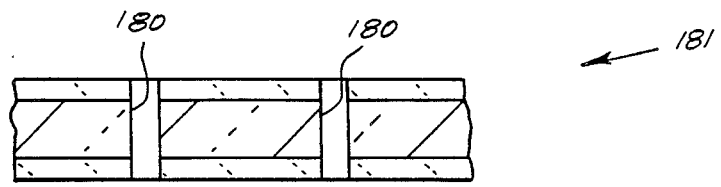

Referring to FIGS. 9A-9F, there is illustrated the series of steps to assemble a multi-layer circuit combining a plurality of glass substrates, circuit foil and a unique technique to interconnect the layers of circuit foil. In FIG. 9A, a first ceramic substrate 170 is illustrated with a coating or glaze of bonding glass 176 (having the same composition as glass 16) on opposite surfaces 172 and 174. It is also within the terms of the present invention to substitute the glaze with a preform of glass 176. The glass coated substrate 178 next has any desired number of through-holes 180 formed therethrough by any desired technique such as punching or laser drilling. The result structure 181 is illustrated in FIG. 9B.

Figure 9C:
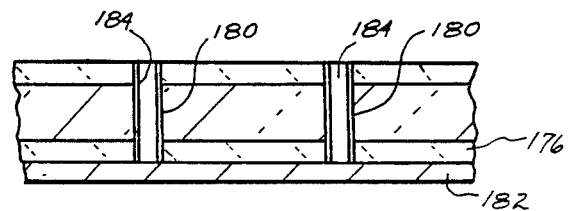

As shown in FIG. 9C, a layer of deoxidized or oxygen-free copper foil 182 is preferably disposed against the glass coating 176 on the underside of the substrate. Metallic wires 184 having a length substantially equal to the length of the through-holes 180 are inserted into the latter. This step may be accomplished by inserting a wire into a through-hole and cutting the wire essentially flush with the upper side of the substrate after the wire makes electrical contact with the layer of foil 182. In order to insure insertion of the wire into the through-hole during the manufacturing process, the wire preferably has a substantially smaller diameter than the diameter of the through-hole. For example, if the diameter of the through-hole is about 5 mils, the diameter of the wire may be from about 3 to about 4 mils. These sizes are only exemplary and the wire may have any diameter as compared to that of the through-hole, assuming that the wire will contact and bond to layers of foil 182 and 186 disposed at either end of the through-hole.

Figure 9D:
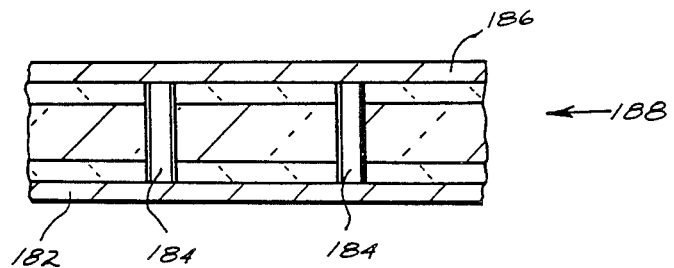

The next step, as illustrated in FIG. 9D, is to dispose a layer of foil 186 on the upper surface of the glass coated substrate. The layers of foil 182 and 186 may be permanently attached to the glazed substrate by heating the assembly 188 to a temperature in the range of about 600° to about 1000° C. The assembly 188 may be subjected to a lamination pressure of less than about 300 psi to enhance the adherence of the substrate to the layers of foil.

The wire 184 is preferably selected from a high expansivity alloy, preferably about 60% IACS, which is in a semi-solid state at the processing temperature required to bond the glass to the layers of foil and the substrate, in the range of about 600° to about 1000° C. The material of the wire is further selected so that in the semi-solid state, it has about 2 to about 40 volume percent of liquid and preferably between 5 to about 25 volume percent of liquid. The liquid phase of the metal wire brazes the wire to the layers of foil 182 and 186. It is important that the wire does not slump in the through-hole to the extent that it is not in contact with one or both of the layers of foil.

This unique means of interconnecting two layers of foil separated by a glazed substrate, as more fully described in the application entitled "A Method of Joining Metal Components" by Pryor et al., relies on the substantially lower coefficient of thermal expansion (CTE) of the ceramic substrate, approximately $50 \times 10^{-7}$ in/in/°C., as compared with the higher CTE of the copper wire, approximately $160 \times 10^{-7}$ in/in/°C. The differential in the CTE between the ceramic and wire results in a greater linear expansion of the wire as compared to the linear expansion of the through-hole. The wire is therefore pressed against the layers of foil, provided that the rate of slump is kept within the limits determined by the specific material system being processed. After the wire is brazed to the two layers of foil and the assembly is cooled, the bonded wire may be in a state of tension. Therefore, the material for the wire is selected to have sufficient ductility after exposure to the bonding temperature regime required for the particular material system.

The wire may be formed of a copper alloy consisting essentially of an element selected from the group consisting of about 2 to about 13% Sn, about 0.2 to about 4% P, about 5 to about 15% Sb, about 3 to about 6% Si, about 4 to about 12% As and mixtures thereof; up to about 4% iron; and the balance copper.

An example of an alloy which may form a suitable wire in the environment described herein is a copper alloy containing about 8% Sn, about 0.025% P, about 2% Fe and the remainder copper. Other examples are Cu with about 2% P, Cu with about 12% Sb, Cu with about 5% Si, Cu with about 9% As and ternary or quaternary combinations of these alloys. It is within the scope of the present invention to use any other alloy system having the desired high conductivity properties in conjunction with the described semi-solid state at the processing temperature.

Figure 9E:
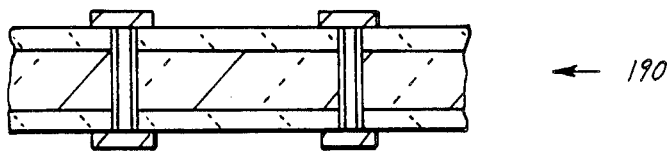
Figure 9F:
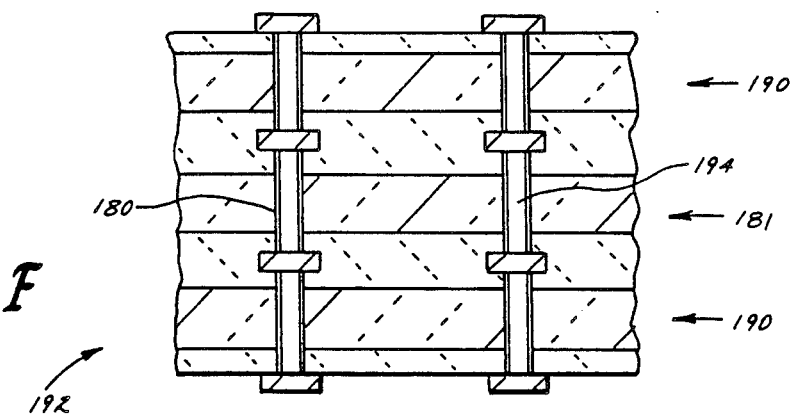

Referring to FIG. 9E, the assembly 188 has layers of foil 182 and 184 with circuitry of any desired configuration formed thereon using any desired technique such as photo-etching. Two or more of the resulting structures 190, may be stacked with a structure 181 as illustrated in FIG. 9B disposed therebetween. The result is a multi-layer assembly 192 as shown in FIG. 9F.

The assembly may be assembled by placing an assembly 181 on the top side of an assembly 190. Then a wire 194 which may be selected of the same material as wire 184 is inserted on the through-holes 180. As described herein, the wire is cut off to have the same length as the through-hole 180. Then a second assembly 190 is stacked on the top side of assembly 181 and the stacked assemblies are heated to the bonding temperature to form multi-layer assembly 192. Although the assembly has been described as having a bottom and top side orientation, it is within the terms of the present invention to orient the elements in any desired position during their assembly.

Figure 2:
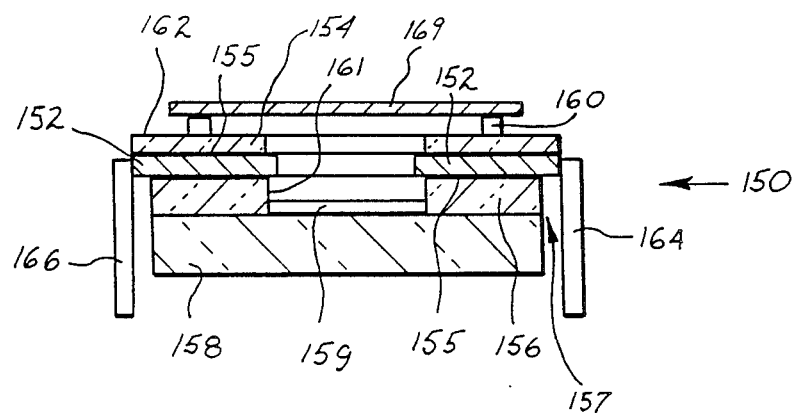
FIG. 2 illustrates a side brazed package in accordance with the present invention.

Referring to FIG. 2, there is illustrated a ceramic sidebrazed package 150 which incorporates a deoxidized or oxygen free copper or copper alloy circuit foil 152, of the type described herein. The foil layer is preferably sealed between ceramic layers 154 and 156 with a bonding or sealing glass 155 of the same composition as glass 16 described herein. The glass can either be applied to the sealing surfaces of the ceramic substrate as a slurry, by dipping or spraying. In addition, the sealing glass can be a solid, pore-free preform disposed between the foil and the ceramic layers. A ceramic substrate 157 is preferably formed of a ceramic layer 158 bonded to an intermediate ceramic layer 156 by any conventional technique such as heating to the bonding temperature. The ceramic layer 156 has a hollow central portion 161 to form a cavity 163. A die attach metallization layer 159 may be coated on the surface of layer 158 within the confines of the cavity 163. The metallization layer may be formed by any technique such as applying a tungsten or molymanganese powder and heating to the sintering temperature. A seal ring 160 disposed on the outer surface 162 of ceramic layer 154. The seal ring is preferably a deoxidized or oxygen free copper or copper alloy foil which is sealed by glass 155 to the ceramic 154 with the glass sealing techniques associated with the circuit foil layer 152. Leads 164 and 166 are soldered to the outer extending portions of foil layer 152. A cover 169, of any desired material such as metal or alloy, may be sealed to the seal ring 160 using any desired technique such as soldering.

The ceramic layer 154 is constructed with a hollow central portion 165 to permit the placement of an electronic or semiconductor device 167 on the metallization 159 and the connection of lead wires from the device 167 to the circuit foil 152.

The process of constructing the side brazed package 150 may include the steps of first constructing the ceramic substrate 157 by bonding the ceramic layers 156 and 158 together in a high temperature environment of about 1500° C. At the same time, the die attach metallization 159 may be sintered within the cavity 161. Then, circuit foil 152 is disposed between substrate 157 and ceramic layer 154. The sealing glass 155 is applied to opposite surfaces of foil 152 by the techniques described herein, to seal the foil between layers 154 and 157. Also, a copper seal ring 160 may be affixed to ceramic layer 154 using a sealing glass 158 with the same bonding techniques as with the foil 152. An electronic component 167 may be attached to the metallization 159 and lead wires connected to the device 167 and the ends of the circuit foil 152. Finally a cover 169 is sealed to the seal ring 160.

The patents, patent applications and publications set forth in this application are intended to be incorporated by reference herein.

It is apparent that there has been provided in accordance with the present invention hybrid and multi-layer circuitry which fully satisfies the objects, means and advantages set forth hereinabove. While the invention has been described in combination with the embodiments thereof, it is evident that many alternative, modifications and variations will be apparent to those skilled in the art in light of the foregoing description. Accordingly, it is intended to embrace all such alternatives, modifications and variations as fall within the spirit and broad scope of the appended claims.

What is claimed is:

1. The process of forming a circuit assembly, comprising the steps of:
   providing a ceramic substrate;
   providing a layer of copper alloy foil, said copper alloy selected from the group consisting of deoxidized copper alloy and oxygen free copper alloy;
   providing a bonding glass which forms a flowable mass at a temperature of less than about 1000° C.;
   disposing a layer of said bonding glass between said substrate and the layer of foil; and
   firing the assembly of the foil layer, the layer of glass and the substrate at a temperature of less than about 1000° C. under reducing conditions whereby the layer of glass bonds the foil layer to said substrate.

2. The process of claim 1 including the step of selecting said copper alloy foil from a material having alloy additions which make up less than about 10% of the alloy and the remainder being copper.

3. The process of claim 2 including the step of selecting said bonding glass from the group consisting of silicate, borosilicate, phosphate and zinc borosilicate glasses.

4. The process of claim 3 wherein said bonding glass is a borosilicate glass of a general composition MO—$B_2O_3$—$SiO_2$ where MO=$Al_2O_3$, BaO, CaO, $Na_2O$, SrO, $ZrO_2$, ZnO, $K_2O$ and mixtures thereof.

5. The process of claim 3 including the step of selecting the ceramic of said substrate from the group consisting of alumina having a purity of over about 90%, silica, alumina silicate, silicon carbide, berylia, zirconia, zircon and mixtures thereof.

6. The process of claim 5 wherein said step of firing the assembly includes disposing said assembly in an atmosphere of gas selected from the group consisting of nitrogen, nitrogen-4% hydrogen, argon and mixtures thereof.

7. The process of claim 5 further including the step of forming circuitry in the layer of copper alloy foil.

8. The process of claim 7 wherein the step of forming circuitry includes the step of photo etching said layer of foil.

9. The process of claim 5 wherein said step of disposing a layer of said bonding glass includes the step of providing a substantially pore-free preform of the bonding glass; and
   disposing said preform between the substrate and the layer of foil.

10. The article produced by the process of claim 9.

11. The process of claim 5 wherein said step of disposing a layer of said bonding glass includes the steps of:
    mixing particles of said bonding glass with a binder and a vehicle to form a glass plate;
    coating said glass paste on at least one surface of said ceramic substrate; and
    sintering the bonding glass onto the surface of the substrate.

12. The article produced by the process of claim 1.

13. A circuit assembly, comprising:
    a ceramic substrate,
    a layer of copper alloy foil, said copper alloy selected from the group consisting of oxygen free and deoxidized copper alloy; and
    a layer of bonding glass which forms a flowable mass at a temperature below about 1000° C. bonding the ceramic substrate to said layer of alloy foil.

14. The circuit assembly of claim 13 wherein said copper alloy foil consists essentially of alloy additions which make up less than about 10% of the alloy and the remainder being copper.

15. The circuit assembly of claim 14 wherein said bonding glass is selected from the group consisting of silicate, borosilicate, phosphate and zinc borosilicate glasses.

16. The circuit assembly of claim 15 wherein said bonding glass is a borosilicate glass of a general composition MO—$B_2O_3$—$SiO_2$ where MO=$Al_2O_3$, BaO, CaO, $ZrO_2$, $Na_2O$, SrO, $K_2O$ and mixtures thereof.

17. The circuit assembly of claim 16 wherein said ceramic substrate is selected from the group consisting of alumina having a purity of over about 90%, silica, silicon carbide, zirconia, berylia, alumina silicate, zircon and mixtures thereof.

18. The circuit assembly of claim 17 wherein said copper alloy foil has a circuit pattern thereon.

19. A multi-layer circuit assembly, comprising:
   a first ceramic substrate,
   a first layer of copper alloy foil;
   a bonding glass which forms a flowable mass at a temperature below about 1000° C., first and second layers of said bonding glass being disposed on first and second opposing surfaces of said first substrate, respectively, said first layer of bonding glass bonding said first layer of copper alloy foil to the first surface of said first substrate;
   at least a second ceramic substrate, said second ceramic substrate having at least a third layer of said bonding glass on a first surface thereof;
   at least a second layer of copper alloy foil, said second layer of copper foil being bonded to said second ceramic substrate by a third layer of said bonding glass;
   said first and second layers of copper alloy foil having circuitry formed therein,
   said first and second layers of copper alloy foil being selected from the group consisting of oxygen free copper alloy and deoxidized copper alloy;
   said first and second ceramic substrates having first and second layers of copper foil bonded thereon, respectively, being stacked and bonded to each other with said second layer of bonding glass whereby said second layer of copper alloy foil is disposed adjacent the second surface of said first substrate.

20. The multi-layer circuit assembly of claim 19 further including at least one through-hole extending through said first and second substrates and said layers of bonding material, a conductor disposed in said at least one through-hole for electrically connecting said first and said second layers of copper alloy foil.

21. The multi-layer circuit assembly of claim 20 wherein said bonding glass is a borosilicate glass of a general composition MO—$B_2O_3$—$SiO_2$ where MO=$Al_2O_3$, BaO, CaO, $ZrO_2$, ZnO, $Na_2O$, SrO, $K_2O$ and mixtures thereof.

22. The multi-layer circuit assembly of claim 21 wherein said first and second ceramic substrates are selected from the group consisting of alumina having a purity of over about 90%, silica, silicon carbide, zirconia, berylia, zircon, alumina silicate and mixtures thereof.

23. A ceramic side-brazed package comprising a ceramic substrate having a cavity therein;
   a copper alloy circuit foil having a first surface bonded to said ceramic substrate, said copper alloy foil being selected from the group consisting of oxygen-free copper alloy and deoxidized copper alloy;
   a ceramic layer disposed on a second surface of said circuit foil;
   a first layer of bonding glass between said ceramic substrate and a first surface of said circuit foil and a second layer of bonding glass between the ceramic layer and a second surface of said circuit foil for bonding the foil between the ceramic layer and the ceramic substrate.

24. The side-brazed package of claim 23 wherein said bonding glass is a borosilicate glass of a general composition MO—$B_2O_3$—$SiO_2$ where MO=$Al_2O_3$, BaO, CaO, $ZrO_2$, ZnO, $Na_2O$, SrO, $K_2O$ and mixtures thereof.

25. The side-brazed package of claim 24 wherein said ceramic substrate and said ceramic layer are formed of materials selected from the group consisting of alumina having a purity of over about 90%, silica, silicon carbide, zirconia, berylia and zircon.

26. The side-brazed package of claim 25 further including a seal ring bonded to the ceramic layer with a third layer of said bonding glass.

27. The side-brazed package of claim 26 further including a cover sealed to said seal ring.

28. The side-brazed package of claim 27 further including leads connected to the circuit foil.

29. The side-brazed package of claim 28 further including a metallized layer in said cavity of said substrate and being adapted for receiving a semiconductor device.

* * * * *